(12) United States Patent
Tang et al.

(10) Patent No.: US 12,334,441 B2
(45) Date of Patent: Jun. 17, 2025

(54) SEMICONDUCTOR DEVICE AND SEMICONDUCTOR LAYOUT STRUCTURE

(71) Applicant: CHANGXIN MEMORY TECHNOLOGIES, INC., Hefei (CN)

(72) Inventors: Li Tang, Hefei (CN); Cheng Chen, Hefei (CN); Yuxia Wang, Hefei (CN); Wei Jiang, Hefei (CN); Jing Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 463 days.

(21) Appl. No.: 17/703,994

(22) Filed: Mar. 25, 2022

(65) Prior Publication Data

US 2023/0197616 A1 Jun. 22, 2023

(30) Foreign Application Priority Data

Dec. 20, 2021 (CN) .......................... 202111564844.5

(51) Int. Cl.
*H10D 89/00* (2025.01)
*H01L 23/528* (2006.01)
*H10D 62/10* (2025.01)
*H10D 89/10* (2025.01)

(52) U.S. Cl.
CPC ....... *H01L 23/5286* (2013.01); *H10D 62/106* (2025.01); *H10D 89/10* (2025.01)

(58) Field of Classification Search
CPC ............. H01L 27/0207; H01L 29/0619; H01L 29/0623; H01L 29/0684; H01L 23/5286; H10D 89/10; H10D 89/931
See application file for complete search history.

(56) References Cited

U.S. PATENT DOCUMENTS

| | | | |
|---|---|---|---|
| 10,366,954 B1* | 7/2019 | Kim | G06F 30/394 |
| 2013/0228877 A1* | 9/2013 | Sugimoto | H01L 27/11807 257/401 |
| 2019/0148407 A1* | 5/2019 | Guo | H01L 27/0924 257/206 |
| 2020/0168700 A1* | 5/2020 | Song | H01L 29/0642 |

FOREIGN PATENT DOCUMENTS

CN 105811927 A 7/2016

* cited by examiner

*Primary Examiner* — Reema Patel
(74) *Attorney, Agent, or Firm* — Kilpatrick Townsend & Stockton LLP

(57) ABSTRACT

The present disclosure provides a semiconductor device and a semiconductor layout structure. In the semiconductor device, a guard ring of a first type is arranged on at least one side of a transistor of a second type, and a guard ring of a second type is arranged on at least one side of a transistor of a first type, such that a plurality of signal lines in a first metal layer in the semiconductor layout structure may be arranged between a first power source line and a first ground line. Furthermore, in a second metal layer, a plurality of second power source lines are connected to one first power source line, and a plurality of second ground lines are connected to one first ground line.

19 Claims, 14 Drawing Sheets

SEMICONDUCTOR DEVICE AND SEMICONDUCTOR LAYOUT STRUCTURE

CROSS REFERENCE TO RELATED APPLICATION

This application claims priority to Chinese Patent Application No. 202111564844.5, titled "SEMICONDUCTOR DEVICE AND SEMICONDUCTOR LAYOUT STRUCTURE" and filed to the China National Intellectual Property Administration on Dec. 20, 2021, the entire contents of which are incorporated herein by reference.

TECHNICAL FIELD

The present disclosure relates to the field of memory technology, and more particularly, to a semiconductor device and a semiconductor layout structure.

BACKGROUND

With increasing demands of the market for performance of semiconductor devices, sizes of the semiconductor devices become smaller and smaller. To adapt to trend towards smaller sizes of the semiconductor devices, it is necessary to further optimize the semiconductor devices and semiconductor layout structures.

SUMMARY

The present disclosure aims to provide a semiconductor device and a semiconductor layout structure with a smaller size.

A first aspect of the present disclosure provides a semiconductor device, including: a substrate of a first type; a well of a second type, arranged on the substrate of the first type; at least one transistor of a first type, arranged on the well of the second type; at least one transistor of a second type, arranged on the substrate of the first type; at least one guard ring of a first type, the at least one guard ring of the first type being arranged on the substrate of the first type and being positioned on at least one side of the transistor of the second type; and at least one guard ring of a second type, the at least one guard ring of the second type being arranged on the well of the second type and being positioned on at least one side of the transistor of the first type.

A second aspect of the present disclosure provides a semiconductor layout structure, including: a device layer including the semiconductor device according to any one of the embodiments of the first aspect of the present disclosure; and a first metal layer positioned above the device layer, the first metal layer being configured to control the semiconductor device.

A third aspect of the present disclosure provides a semiconductor layout structure, including: a device layer. The device layer includes: a substrate of a first type, a well of a second type, a plurality of transistor of a first type, a plurality of transistor of a second type, at least one guard ring of a first type, and at least one guard ring of a second type. The well of the second type is arranged on the substrate of the first type, the plurality of transistors of the first type are arranged in sequence on the well of the second type, and the plurality of transistors of the second type are arranged in sequence on the substrate of the first type. The at least one guard ring of the first type is arranged on the substrate of the first type and is positioned on at least one side of the plurality of transistors of the second type. The at least one guard ring of the second type is arranged on the well of the second type and is positioned on at least one side of the plurality of transistors of the first type. The semiconductor layout structure also includes a first metal layer, wherein the first metal layer is positioned above the device layer and is configured to control the device layer.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

In the specification, the claims and the foregoing accompanying drawings of the present disclosure, a term such as a first, a second, a third or a fourth (if present) is intended to distinguish between similar objects but is not necessarily intended to describe a particular sequence or precedence order. It is to be understood that data used like this may be interchangeable where appropriate, such that the embodiments of the present disclosure described herein can be implemented in sequences excluding those illustrated or described herein. Furthermore, terms such as "comprise", "have" or other variants thereof are intended to cover a non-exclusive "comprise", for example, processes, methods, systems, products or devices comprising a series of steps or units are not limited to these steps or units listed explicitly, but comprise other steps or units not listed explicitly, or other steps or units inherent to these processes, methods, systems, products or devices.

Figure 1:
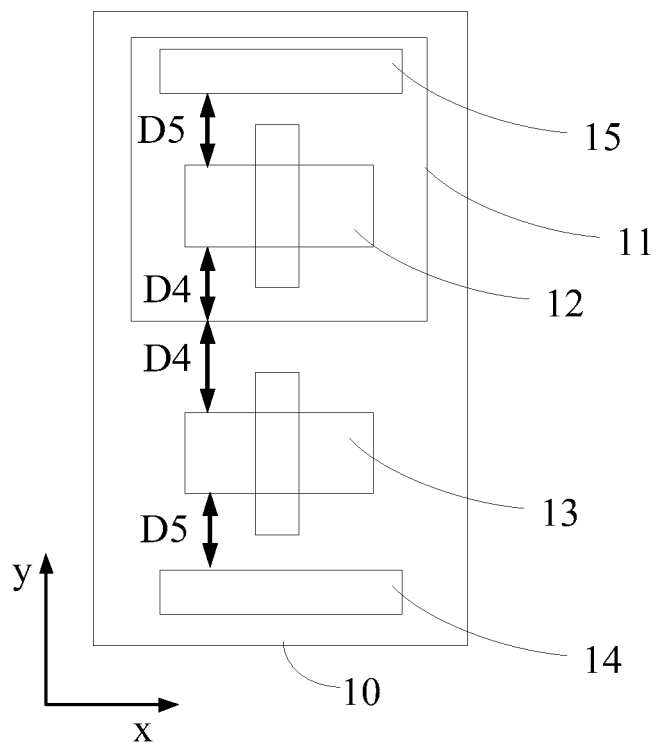
FIG. 1 is a schematic structural diagram of a semiconductor device.

FIG. 1 is a schematic structural diagram of a semiconductor device. The semiconductor device includes: a substrate 10 of a first type, a well 11 of a second type, at least one transistor 12 of a first type, at least one transistor 13 of a second type, at least one guard ring 14 of a first type, and at least one guard ring 15 of a second type. The well 11 of the second type, the at least one transistor 13 of the second type and the at least one guard ring 14 of the first type are arranged on the substrate 10 of the first type. The at least one transistor 12 of the first type and the at least one guard ring 15 of the second type are arranged on the well 11 of the second type.

An example is taken in FIG. 1 where the semiconductor device includes one transistor 12 of the first type, one transistor 13 of the second type, one guard ring 14 of the first type, and one guard ring 15 of the second type. A two-dimensional coordinate system x-y is established on a plane where the semiconductor device is positioned in FIG. 1. In a direction y, the transistor 13 of the second type is arranged under the transistor 12 of the first type, the guard ring 14 of the first type is arranged under the transistor 13 of the second type, and the guard ring 15 of the second type is arranged above the transistor 12 of the first type.

The first type and the second type are different types. For example, the first type is a P type, and the second type is an N type; or the first type is the N type, and the second type is the P type.

Figure 2:
FIG. 2 is a schematic diagram of a semiconductor layout structure.

FIG. 2 is a schematic diagram of a semiconductor layout structure. A three-dimensional coordinate system x-y-z is established in a direction z perpendicular to the two-dimensional coordinate system x-y in FIG. 1. A device layer L1, a first metal layer L2, and a third metal layer L3 are included in sequence from top to bottom in the direction z. The device layer L1 includes at least one semiconductor device as shown in FIG. 1. The first metal layer L2 is positioned above the device layer L1 and is configured to control the at least one semiconductor device in the device layer L1.

Figure 3:
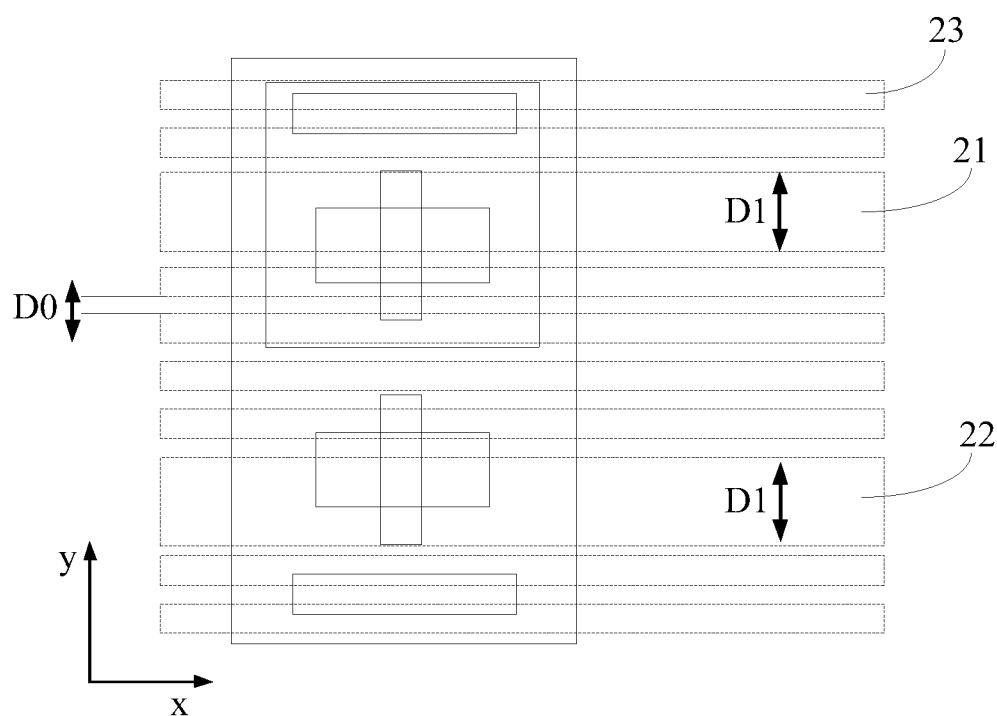
FIG. 3 is a schematic structural diagram of a first metal layer.

FIG. 3 is a schematic structural diagram of a first metal layer, including: a first power source line 21, a first ground line 22 and a plurality of signal lines 23 extending in the direction x. In the direction y, at least one signal line 23 is arranged on two sides of the first power source line 21 and the second ground line 22. Positions of the first power source line 21 and the first ground line 22 in FIG. 3 may be interchanged.

Figure 4:
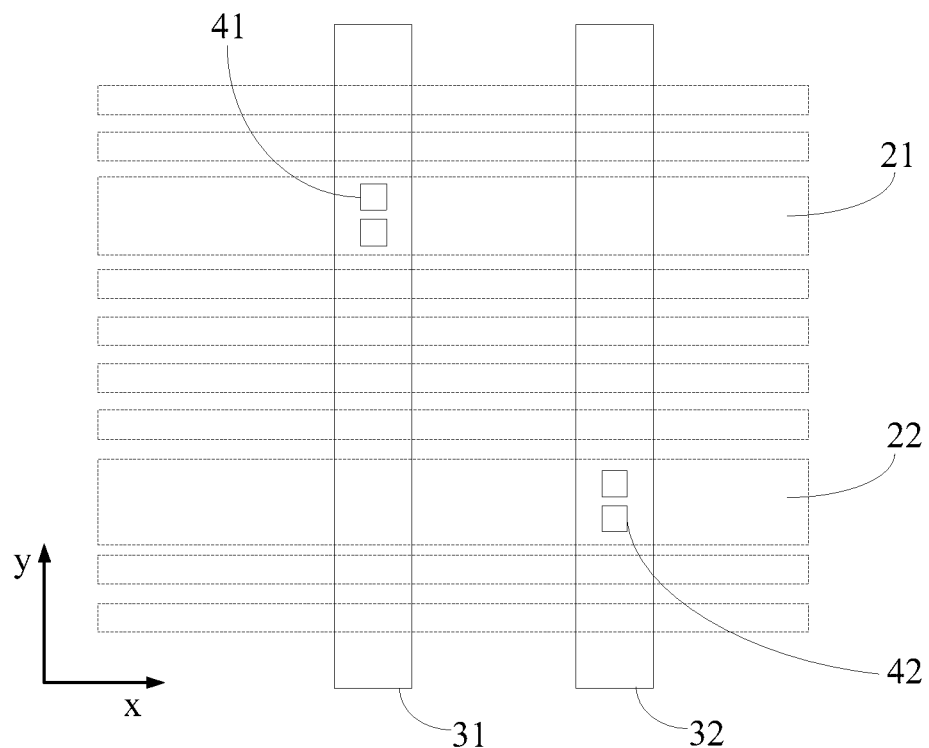
FIG. 4 is a schematic structural diagram of a second metal layer.

FIG. 4 is a schematic structural diagram of a second metal layer, including: a second power source line 31 and a second ground line 32 extending in the direction y. The second power source line 31 in the second metal layer L3 is connected to the first power source line 21 in the first metal layer L2 through two connection holes 41, and the second ground line 32 in the second metal layer L3 is connected to the first ground line 22 in the second metal layer L2 through two connection holes 42.

In the semiconductor device and the semiconductor layout structure provided in the above FIG. 1 to FIG. 4, numerical values of widths D1 of the first power source line 21 and the first ground line 22 in the first metal layer L1 are relatively large, resulting in larger sizes of the semiconductor device and the semiconductor layout structure. Therefore, how to optimize the semiconductor device and the semiconductor layout structure to make their sizes smaller is a technical problem to be solved by the technical solutions provided by the embodiments of the present disclosure. The technical solutions of the present disclosure are described in detail below with reference to some embodiments. The following embodiments may be combined with each other, and the same or similar concepts or processes may not be repeated in some embodiments.

Figure 5:
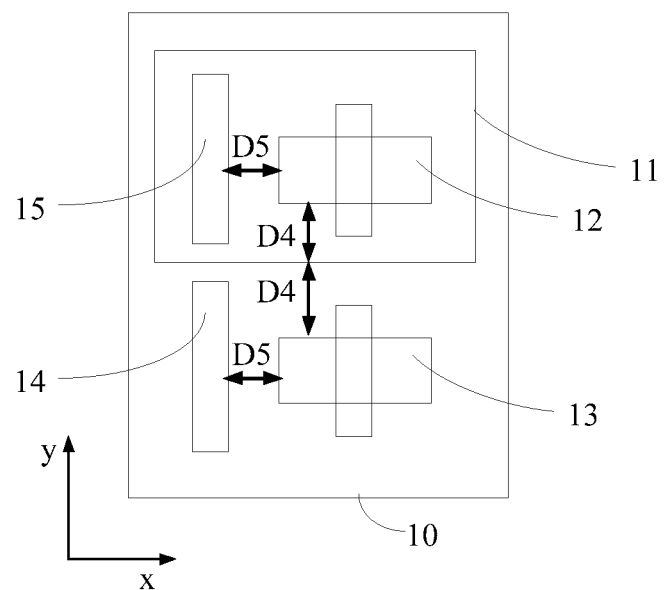
FIG. 5 is a schematic structural diagram of a semiconductor device according to an embodiment of the present disclosure.

FIG. 5 is a schematic structural diagram of a semiconductor device according to an embodiment of the present disclosure. The semiconductor device includes: a substrate 10 of a first type, a well 11 of a second type, at least one transistor 12 of a first type, at least one transistor 13 of a second type, at least one guard ring 14 of a first type, and at least one guard ring 15 of a second type. The well 11 of the second type, the at least one transistor 13 of the second type and the at least one guard ring 14 of the first type are arranged on the substrate 10 of the first type. The at least one transistor 12 of the first type and the at least one guard ring 15 of the second type are arranged on the well 11 of the second type.

A two-dimensional coordinate system x-y is established on the plane where the semiconductor device in FIG. 5 is positioned. In the direction y, the transistor 13 of the second type is arranged under the transistor 12 of the first type, the guard ring 14 of the first type is arranged on at least one side of the transistor 13 of the second type in the direction x, and the guard ring 15 of the second type is arranged on at least one side of the transistor 12 of the first type in the direction x. The at least one side includes a left side and/or a right side in the direction x in FIG. 5.

An example is taken in FIG. 5 where the semiconductor device includes one transistor 12 of the first type, one transistor 13 of the second type, one guard ring 14 of the first type, and one guard ring 15 of the second type. The guard ring 14 of the first type is arranged on the first side (left side) of the transistor 13 of the second type in the direction x, and the guard ring 15 of the second type is arranged on the first side of the transistor 12 of the first type in the direction x.

Figure 6:
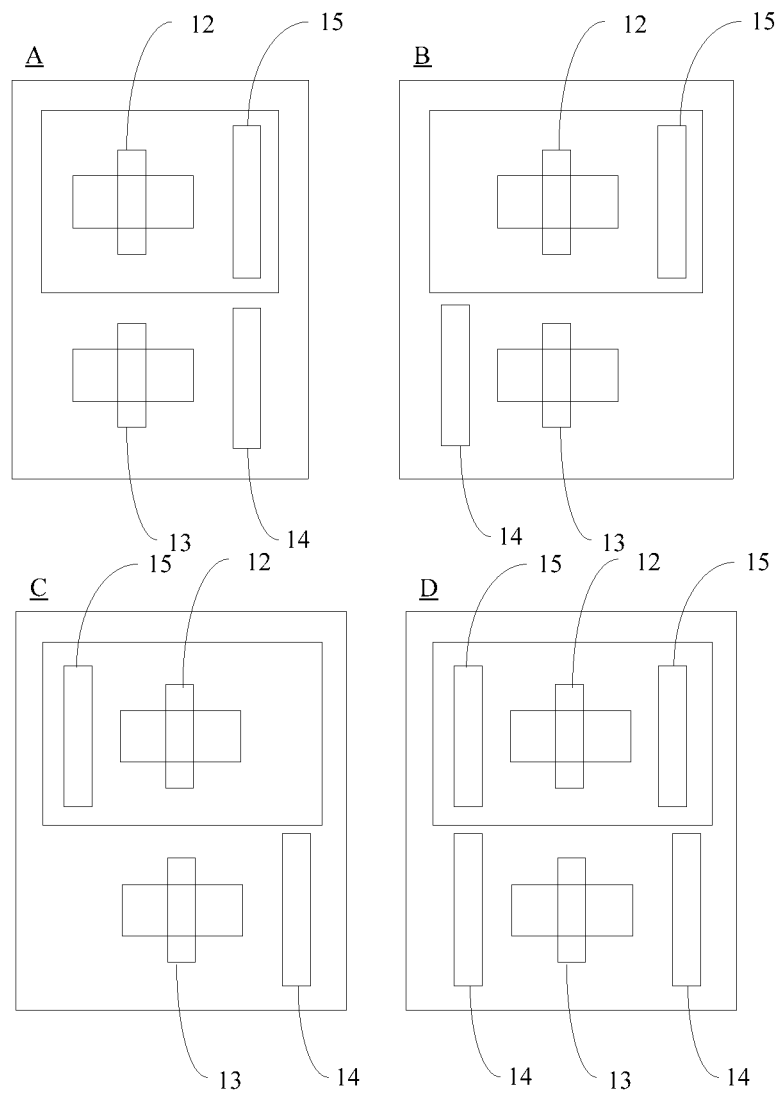
FIG. 6 is a schematic structural diagram of a semiconductor device according to another embodiment of the present disclosure.

FIG. 6 is a schematic structural diagram of a semiconductor device according to another embodiment of the present disclosure. In the semiconductor device A as shown in FIG. 6, the guard ring 14 of the first type is arranged on second side (right side) of the transistor 13 of the second type in the direction x, the guard ring 15 of the second type is arranged on the second side of the transistor 12 of the first type in the direction x. In the semiconductor device B as shown in FIG. 6, the guard ring 14 of the first type is arranged on the first side of the transistor 13 of the second type in the direction x, and the guard ring 15 of the second type is arranged on the second side of the transistor 12 of the first type in the direction x. In the semiconductor device C as shown in FIG. 6, the guard ring 14 of the first type is arranged on the second side of the transistor 13 of the second type in the direction x, and the guard ring 15 of the second type is arranged on the first side of the transistor 12 of the first type in the direction x. In the semiconductor device D as shown in FIG. 6, the guard ring 14 of the first type is arranged on the first side and the second side of the transistor 13 of the second type in the direction x, and the guard ring 15 of the second type is arranged on the first side and the second side of the transistor 12 of the first type in the direction x.

The first type and the second type are different types. For example, the first type is a P type, and the second type is an N type; or the first type is the N type, and the second type is the P type.

To sum up, for the semiconductor device provided in FIG. 6, the guard ring of the first type is arranged on at least one side of the transistor of the second type, and the guard ring of the second type is arranged on at least one side of the transistor of the first type, such that when the semiconductor device is connected to the first metal layer, the widths of the first power source line and the first ground line in the first metal layer may be reduced, thereby achieving the technical effect of reducing the size of the semiconductor layout structure where the semiconductor device is positioned.

Figure 7:
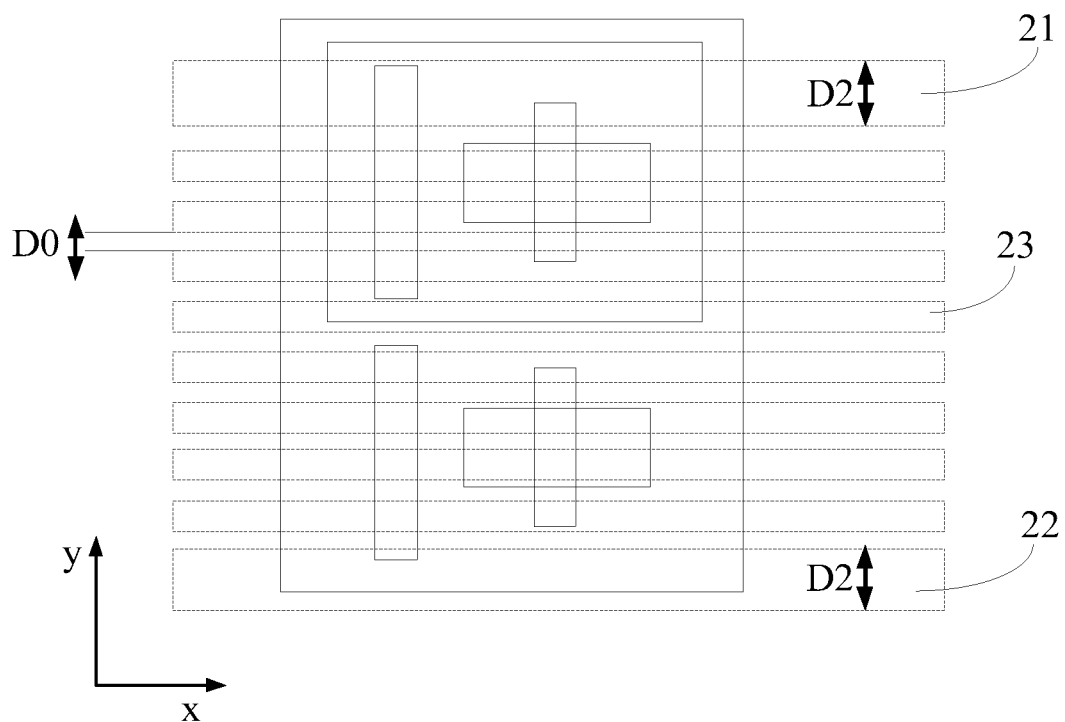
FIG. 7 is a schematic diagram of a semiconductor layout structure according to an embodiment of the present disclosure.

In some embodiments, FIG. 7 is a schematic diagram of a semiconductor layout structure according to an embodiment of the present disclosure. An embodiment of the present disclosure also provides a semiconductor layout structure, including a device layer and a first metal layer. Referring to the structure in FIG. 2, the device layer includes at least one semiconductor device as shown in FIG. 6, the first metal layer is arranged above the device layer in the direction z, and the first metal layer may be configured to control the semiconductor device in the device layer.

As shown in FIG. 7, the first metal layer includes: a first power source line 21, a first ground line 22 and a plurality of signal lines 23 extending in a first direction. The first direction is the direction x in FIG. 7, and the plurality of signal lines 23 are positioned between the first power source line 21 and the first ground line 22. That is, in the direction y in FIG. 7, the first power source line 21 is above the plurality of signal lines 23, and the first ground line 22 is under the plurality of signal lines 23; or the first ground line 22 is above the plurality of signal lines 23, and the first power source line 21 is under the plurality of signal lines 23.

Figure 8:
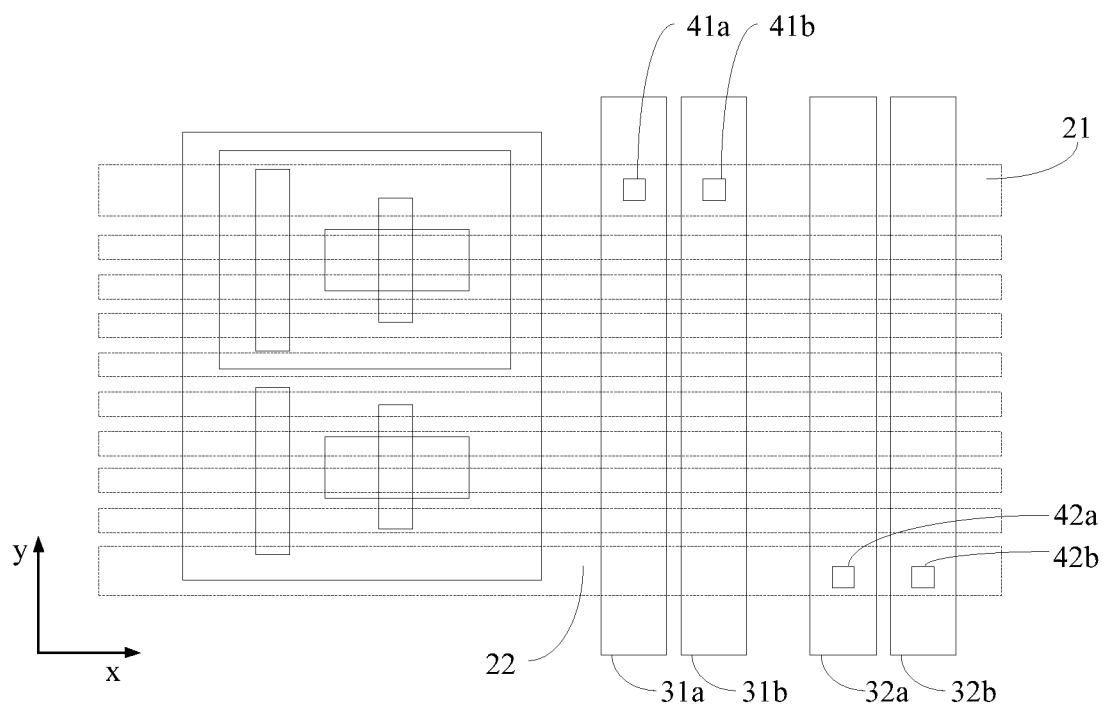
FIG. 8 is a schematic diagram of a semiconductor layout structure according to an embodiment of the present disclosure.

FIG. 8 is a schematic diagram of a semiconductor layout structure according to an embodiment of the present disclosure. On the basis of FIG. 7, the semiconductor layout structure as shown in FIG. 8 also includes a second metal layer. Referring to the structure in FIG. 2, the second metal layer is positioned above the first metal layer in the direction z, and the second metal layer includes a plurality of second power source lines 31 and a plurality of second ground lines 32 extending in the second direction. The second direction is orthogonal to the first direction. That is, when the first direction is the direction x in FIG. 8, the second direction is the direction y in FIG. 8.

In the example as shown in FIG. 8, to reduce the widths of the first power source line 21 and the first ground line 22 in the first metal layer, at least two of the plurality of second power source lines 31 in the second metal layer are connected to the same first power source line 21 in the first metal layer through a connection hole, and at least two of the plurality of second ground lines 32 in the second metal layer are connected to the same first ground line 22 in the first metal layer through the connection hole.

In some embodiments, each of the plurality of second power source lines is connected to the first power source line only through one connection hole. For example, the second power source line 31a is connected to the first power source line 21 through the connection hole 41a, or the second power source line 31b is connected to the first power source line 21 through the connection hole 41b. The second power source line 31a and the second power source line 31b are synchronously connected to the first power source line 21 in parallel. Each of the plurality of second ground lines is connected to the first ground line only through one connection hole. For example, the second ground line 32a is connected to the first ground line 22 through the connection hole 42a, or the second ground line 32b is connected to the first ground line 22 through the connection hole 42b. The second ground line 32a and the second ground line 32b are synchronously connected to the first ground line 22 in parallel. By increasing number of the second power source lines 32 and number of the second ground lines 33 in the second metal layer, density of connection lines in the second metal layer is increased, and a problem of resistance increased due to reduction of the widths of the first power source line 21 and the first ground line 22 in the first metal layer is compensated for. In this way, the first power source line 21 and the plurality of second power source lines 31, and an overall resistance of the first ground line 22 and the plurality of second ground lines 32 still can meet requirements of design criteria such as IR drop and electromigration (EM), etc.

To sum up, in the semiconductor layout structure provided in this embodiment, the guard ring of the first type in the device layer is arranged on at least one side of the transistor of the second type, and the guard ring of the second type is arranged on at least one side of the transistor of the first type, such that a plurality of signal lines in the first metal layer may be arranged between the first power source line and the first ground line. Furthermore, in the second metal layer, a plurality of second power source lines are connected to one first power source line, and a plurality of second ground lines are connected to one first ground line. In this way, requirements for the connection lines and the IR drop are met, only one connection hole needs to be provided on the first power source line to connect one of the plurality of second power source lines, and only one connection hole needs to be provided on the first ground line to connect one of the plurality of second ground lines. In the semiconductor layout structure as shown in FIG. 7, the width D2 of the first power source line and the first ground line is smaller than the width D1 as shown in FIG. 2. That is, the overall width of the semiconductor layout structure as shown in FIG. 7 in the direction y is smaller than the overall width of the semiconductor layout structure as shown in FIG. 2 in the direction y, thereby achieving the technical effect of reducing the size of the semiconductor layout structure.

In some embodiments, in the semiconductor device as shown in FIG. 2 and FIG. 5, a distance D5 between the transistor 12 of the first type and the guard ring of the second type and a distance D5 between the transistor 13 of the second type and the guard ring 14 of the first type both conform to a distance stipulated in process design rules related to an active area. A distance D4 between the transistor 12 of the first type and the well 11 of the second type and a distance D4 between the transistor 13 of the second type and the well 11 of the second type both conform to a distance stipulated in process design rules related to a well. A distance DO between signal lines 23 in the first metal layer of the semiconductor layout structure as shown in FIG. 3 is equal to a distance DO between signal lines 23 in the first metal layer of the semiconductor layout structure as shown in FIG. 7. Number of the signal lines 23 in the first metal layer of the semiconductor layout structure as shown in FIG. 3 is equal to number of the signal lines 23 in the first metal layer of the semiconductor layout structure as shown in FIG. 7. Thus, the technical effect of reducing the size of the semiconductor layout structure is achieved without changing design rules of the semiconductor device and the semiconductor layout structure.

In some embodiments, the device layer and the first metal layer as shown in FIG. 7 may form a standard layout structure unit. In the first metal layer, the first power source line and the first ground line are arranged on upper and lower sides of a plurality of signal lines, such that when the standard layout structure units are arranged in pairs, the semiconductor devices in the device layers of the two standard layout structure units may share the same first power source line or first ground line adjacent in the first metal layer.

Figure 9:
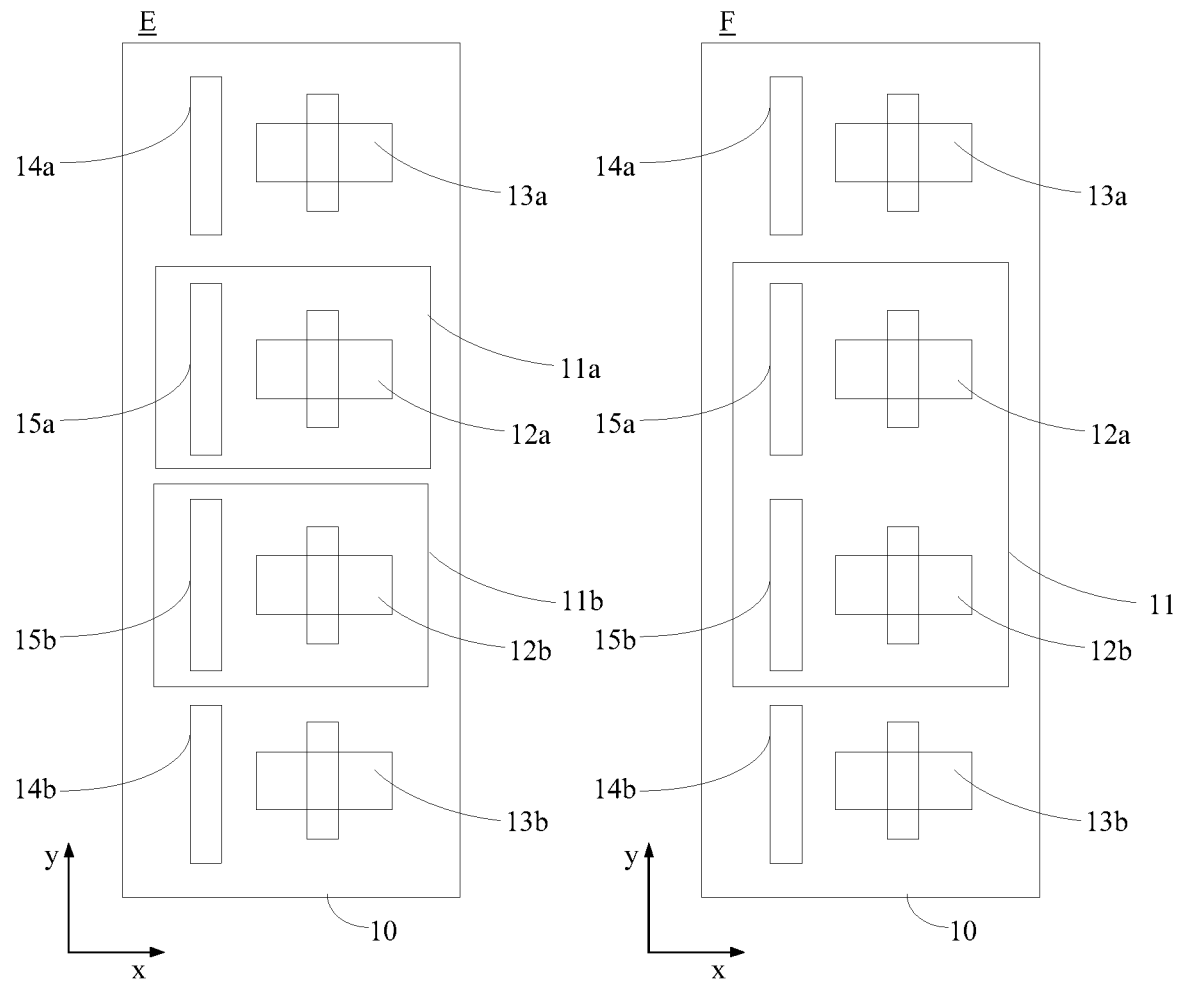
FIG. 9 is a schematic structural diagram of a device layer in the semiconductor layout structure according to an embodiment of the present disclosure.

For example, FIG. 9 is a schematic structural diagram of a device layer in the semiconductor layout structure according to an embodiment of the present disclosure. In a case E on the left side of FIG. 9, the device layer includes two semiconductor devices as shown in FIG. 5, which are denoted as a semiconductor device a and a semiconductor device b. the semiconductor device a is positioned above the semiconductor device b in the direction y, and the two semiconductor devices are arranged on the same substrate 10 of the first type. The transistor 13a of the second type of the semiconductor device a is arranged above the transistor 12a of the first type in the direction y, and the transistor 13b of the second type of the semiconductor device b is arranged below the transistor 12b of the first type in the direction y. The guard ring 14a of the first type of the semiconductor device a is arranged on the left side of the transistor 13a of the second type in the direction x, and the guard ring 15a of the second type of the semiconductor device a is arranged on the left side of the transistor 12a of the first type in the direction x. The guard ring 14b of the first type of the semiconductor device b is arranged on the left side of the transistor 13b of the second type in the direction x, and the guard ring 15b of the second type of the semiconductor device b is arranged on the left side of the transistor 12b of the first type in the direction x. In some embodiments, as in the case F on the right side of FIG. 9, the well 11 of the second type is shared between two semiconductor devices in the device layer. At this moment, the transistor 12a of the first type and the guard ring 15a of the second type of the semiconductor device a as well as the transistor 12b of the first type and the guard ring 15b of the second type of the semiconductor device b are arranged on the same well 11 of the second type.

Figure 10:
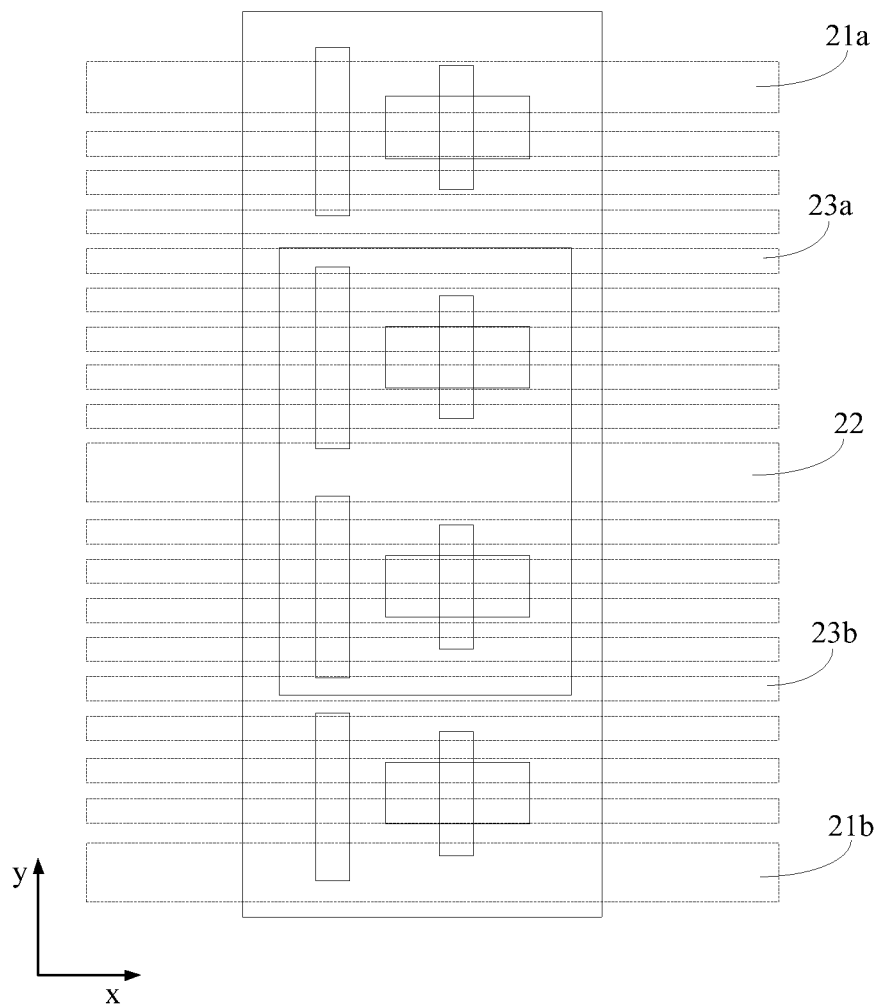
FIG. 10 is a schematic structural diagram of a semiconductor layout structure according to an embodiment of the present disclosure.

FIG. 10 is a schematic structural diagram of a semiconductor layout structure according to an embodiment of the present disclosure. In the semiconductor layout structure as shown in FIG. 10, taking the device layer in the case F on the right side of FIG. 9 as an example, in the first metal layer arranged on the device layer, when the semiconductor device a and the semiconductor device b share the first ground line 22 in the first metal layer, in the direction y there are in sequence included: the first power source line 21a and a plurality of signal lines 23a and the first ground line 22 corresponding to the semiconductor device a, and a plurality of signal lines 23b and the first ground line 21b corresponding to the semiconductor device b.

Figure 11:
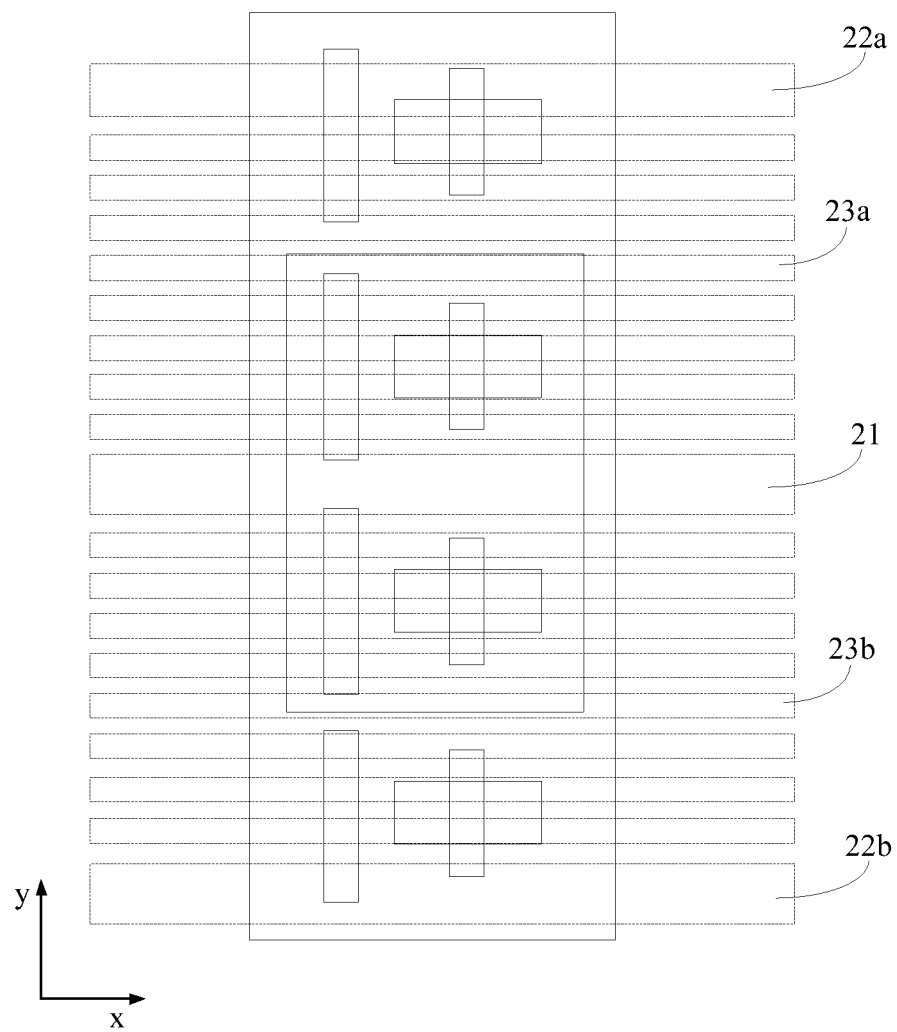
FIG. 11 is a schematic structural diagram of a semiconductor layout structure according to another embodiment of the present disclosure.

FIG. 11 is a schematic structural diagram of a semiconductor layout structure according to another embodiment of the present disclosure. When the semiconductor device a and the semiconductor device b share the first power source line 21 in the first metal layer, in the direction y there are in sequence included: the first ground line 22a and a plurality of signal lines 23a and the first power source line 21 corresponding to the semiconductor device a, and a plurality of signal lines 23b and the first ground line 22b corresponding to the semiconductor device b.

It is to be noted that an example is taken in FIG. 10 and FIG. 11 where the device layer includes two semiconductor devices. In the same manner as above, when the first power source line or first ground line in the first metal layer extends in the direction x, two sides of the first power source line or first ground line may be provided with the standard layout structure units in pair as shown in FIG. 10 or FIG. 11, and the two semiconductor devices in the standard layout structure units may share the adjacent first power source line or first ground line. This variation is an increase in quantity, and its implementation manner and principle are the same, and thus are not to be repeated here.

To sum up, in the semiconductor layout structure provided by this embodiment, in the first metal layer, the first power source line and the first ground line are arranged on the upper and lower sides of a plurality of signal lines, such that the semiconductor devices formed in pairs in the standard layout structure unit may share the adjacent first ground line or the first power source line. In this way, a height of the standard layout structure unit in the direction y is reduced, and the size of the semiconductor layout structure is further reduced.

Figure 12:
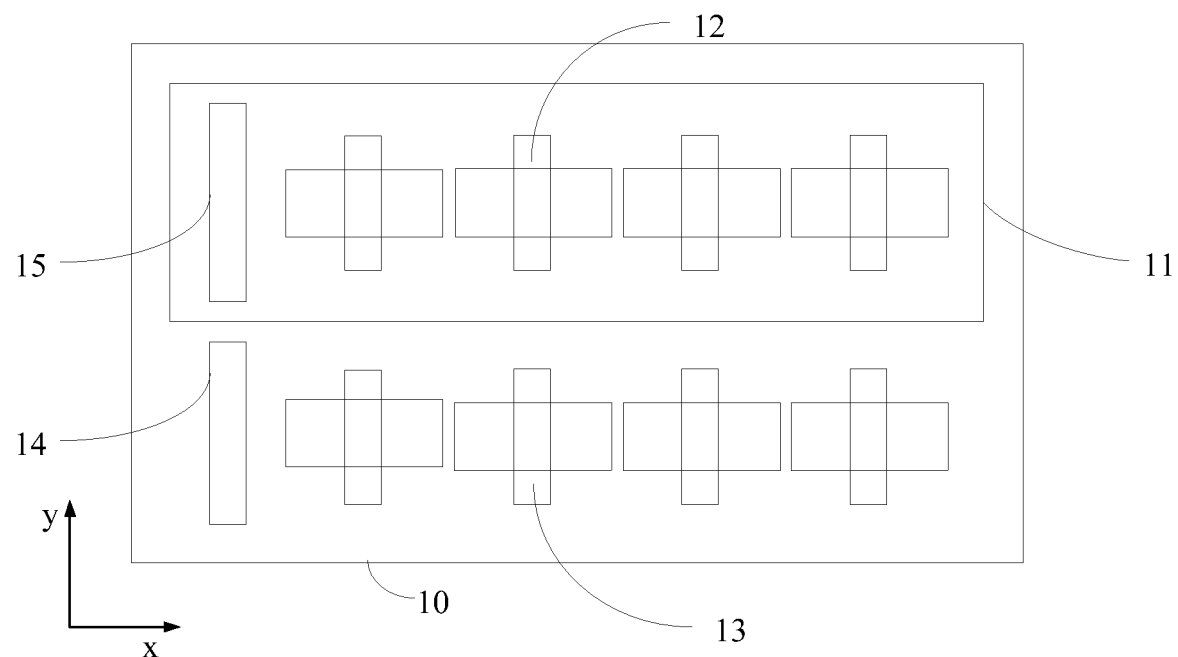
FIG. 12 is a schematic diagram of a semiconductor layout structure according to an embodiment of the present disclosure.

FIG. 12 is a schematic diagram of a semiconductor layout structure according to an embodiment of the present disclosure. An embodiment of the present disclosure also provides a semiconductor layout structure, including a device layer and a first metal layer. Referring to the structure in FIG. 2, the first metal layer is arranged above the device layer in the direction z, and the first metal layer may be configured to control the semiconductor device in the device layer.

In the semiconductor layout structure as shown in FIG. 12, the device layer includes: a substrate 10 of a first type, a well 11 of a second type, a plurality of transistors 12 of a first type, a plurality of transistors 13 of a second type, at least one guard ring 14 of a first type 13, and at least one guard ring 15 of a second type. The well 11 of the second type, the plurality of transistors 13 of the second type and the at least one guard ring 14 of the first type are arranged on the substrate 10 of the first type, and the plurality of transistors 13 of the second type are sequentially arranged in the direction x in FIG. 12. The plurality of transistors 12 of the first type and the at least one guard ring 15 of the second type are arranged on the well 11 of the second type, and the plurality of transistors 12 of the first type are sequentially arranged in the direction x in FIG. 12. The guard ring 14 of the first type is arranged on at least one side of the plurality of transistors 13 of the second type in the direction x, and the guard ring 15 of the second type is arranged on at least one side of the plurality of transistors 12 of the first type in the direction x. The at least one side includes a left side and/or a right side in the direction x in FIG. 12.

Figure 13:
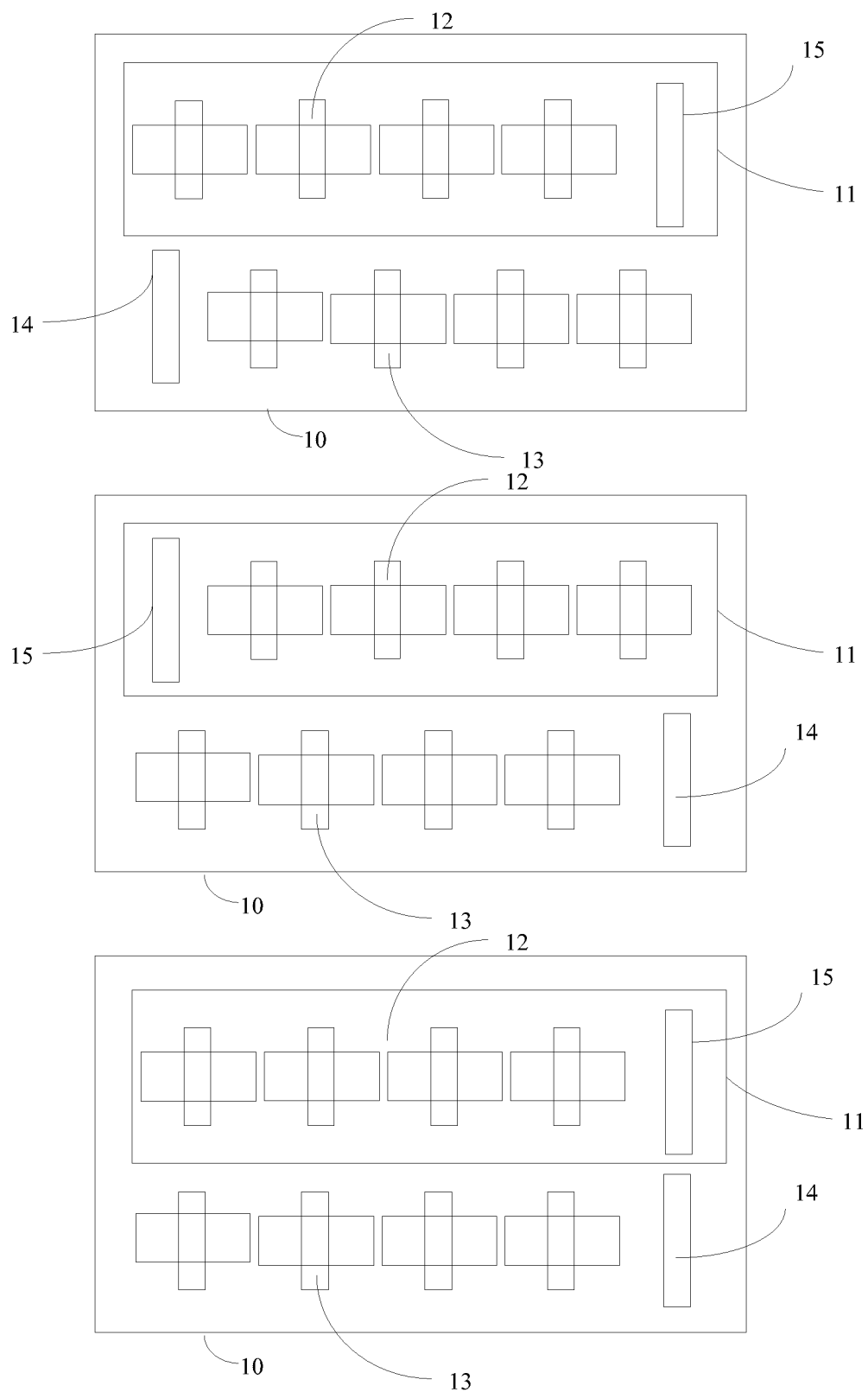
FIG. 13 is a schematic structural diagram of a semiconductor device according to another embodiment of the present disclosure.

An example is taken in FIG. 12 where the semiconductor device includes four transistors 12 of the first type, four transistors 13 of the second type, one guard ring 14 of the first type, and one guard ring 15 of the second type. The guard ring 14 of the first type is provided on the first side (left side) of the four transistors 13 of the second type arranged in sequence in the direction x, and the guard ring 15 of the second type is provided on the first side of the four transistors 12 of the first type arranged in sequence in the direction x. For another example, FIG. 13 is a schematic structural diagram of a semiconductor device according to another embodiment of the present disclosure. As shown in FIG. 13, the guard ring 14 of the first type may be arranged on the first side of the plurality of transistors 13 of the second type in the direction x, and the guard ring 15 of the second type is arranged on the second side (right side) of the plurality of transistors 12 of the first type in the direction x; or the guard ring 14 of the first type may be arranged on the second side of the plurality of transistors 13 of the second type in the direction x, and the guard ring 15 of the second type is arranged on the first side of the plurality of transistors 12 of the first type in the direction x; or the guard ring 14 of the first type may be arranged on the second side of the plurality of transistors 13 of the second type in the direction x, and the guard ring 15 of the second type is arranged on the second side of the plurality of transistors 12 of the first type in the direction x.

The first type and the second type are different types. For example, the first type is a P type, and the second type is an N type; or the first type is the N type, and the second type is the P type.

Figure 14:
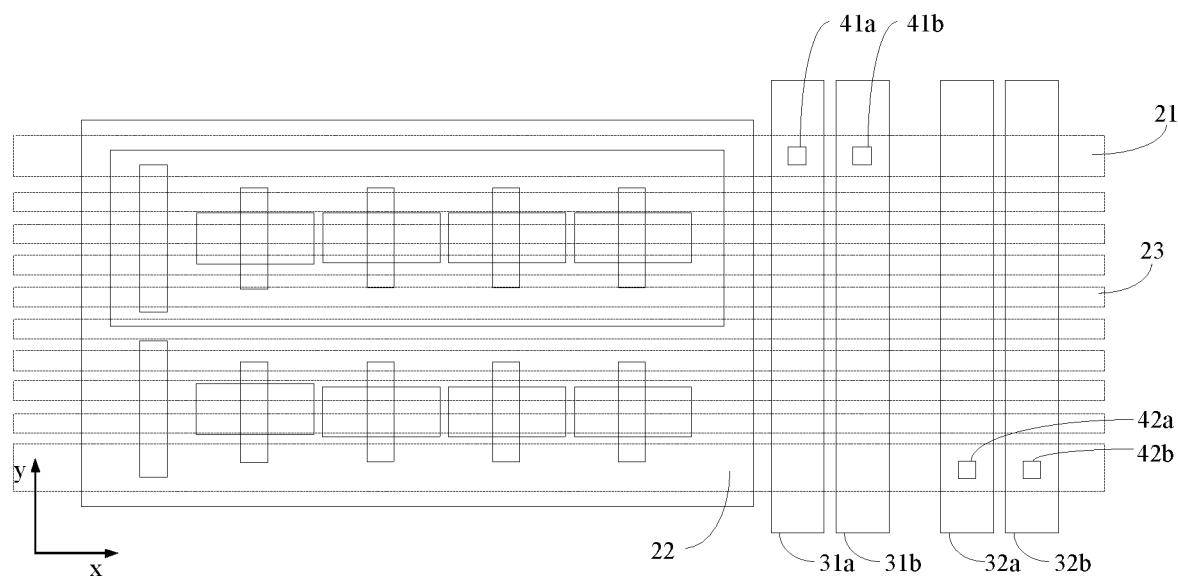
FIG. 14 is a schematic diagram of a semiconductor layout structure according to another embodiment of the present disclosure.

FIG. 14 is a schematic diagram of a semiconductor layout structure according to another embodiment of the present disclosure. An example is taken where the device layer of the semiconductor layout structure in FIG. 14 includes the semiconductor device as shown in FIG. 12, and the structure of the first metal layer and the second metal layer above the device layer is shown. The first metal layer includes: a first power source line 21, a first ground line 22 and a plurality of signal lines 23 extending in the direction x, and the plurality of signal lines 23 are positioned between the first power source line 21 and the first ground line 22. The second metal layer includes a plurality of second power source lines 31 and a plurality of second ground lines 32 extending in the direction y. At least two of the plurality of second power source lines 31 in the second metal layer are connected to the same first power source line 21 in the first metal layer through connection holes, and at least two of the plurality of second ground lines 32 in the second metal layer are connected to the same first ground line 22 in the first metal layer through the connection holes. In some embodiments, the second power source line 31a is connected to the first power source line 21 through the connection hole 41a, the second power source line 31b is connected to the first power source line 21 through the connection hole 41b, and the second power source line 31a and the second power source line 31b are connected in parallel to the first power source line 21 concurrently. Each of the plurality of second ground lines is connected to the first ground line only through one connection hole. For example, the second ground line 32a is connected to the first ground line 22 through the connection hole 42a, or the second ground line 32b is connected to the first ground line 22 through the connection hole 42b. The second ground line 32a and the second ground line 32b are synchronously connected to the first ground line 22 in parallel.

To sum up, in the semiconductor layout structure provided in this embodiment, the guard ring of the first type in the device layer is arranged on at least one side of the transistor of the second type, and the guard ring of the second type is arranged on at least one side of the transistor of the first type, such that a plurality of signal lines in the first metal layer may be arranged between the first power source line and the first ground line. Furthermore, in the second metal layer, a plurality of second power source lines are connected to one first power source line, and a plurality of second ground lines are connected to one first ground line. In this way, requirements for the connection lines and the IR drop are met, only one connection hole needs to be provided on the first power source line to connect one of the plurality of second power source lines, and only one connection hole needs to be provided on the first ground line to connect one of the plurality of second ground lines. In the semiconductor layout structure as shown in FIG. 14, the width of the first power source line and the first ground line is smaller than the width D1 as shown in FIG. 2. That is, the overall width of the semiconductor layout structure as shown in FIG. 13 in the direction y is smaller than the overall width of the semiconductor layout structure as shown in FIG. 2 in the direction y, thereby achieving the technical effect of reducing the size of the semiconductor layout structure.

In some embodiments, the device layer and the first metal layer as shown in FIG. 14 may form a standard layout structure unit. In the first metal layer, the first power source line and the first ground line are arranged on upper and lower sides of a plurality of signal lines, such that when the standard layout structure units are arranged in pairs, the semiconductor devices in the device layers of the two standard layout structure units may share the same first power source line or first ground line adjacent in the first metal layer.

Figure 15:
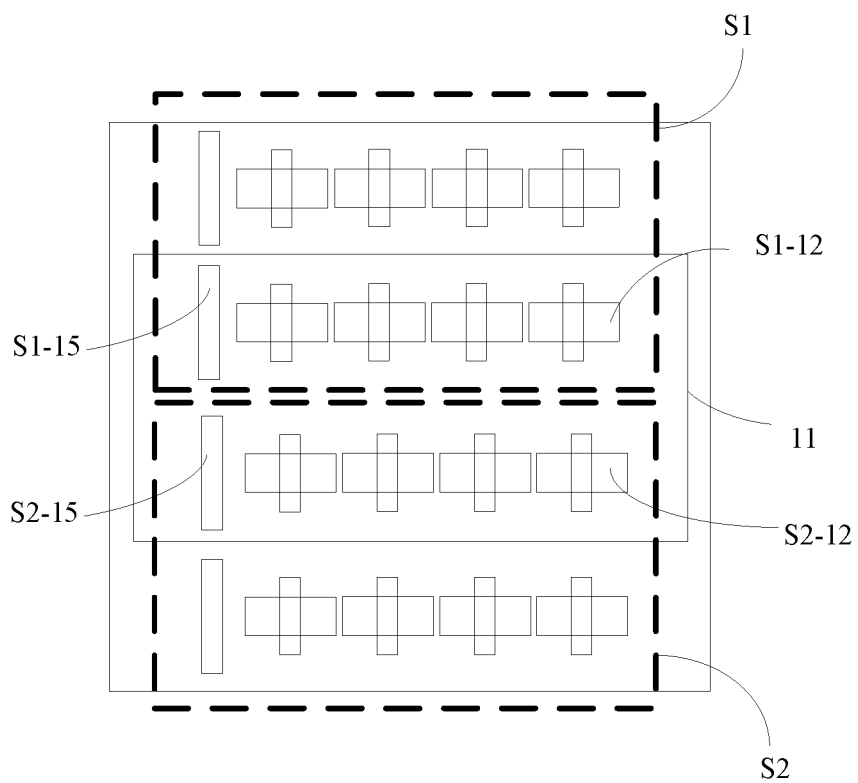
FIG. 15 is a schematic structural diagram of a device layer in the semiconductor layout structure according to an embodiment of the present disclosure.

FIG. 15 is a schematic structural diagram of a device layer in the semiconductor layout structure according to an embodiment of the present disclosure. The device layer includes a semiconductor device S1 and a semiconductor device S2, and the semiconductor device S1 is arranged above the semiconductor device S2 in the direction y. The semiconductor device S1 and the semiconductor device S2 may share the well 11 of the second type. In this way, the transistors S1-12 of the first type and the guard rings S1-15 of the second type of the semiconductor device S1, and the transistors S2-12 of the first type and the guard rings S2-15 of the second type of the semiconductor device S2 are all arranged on the same well 11 of the second type.

Figure 16:
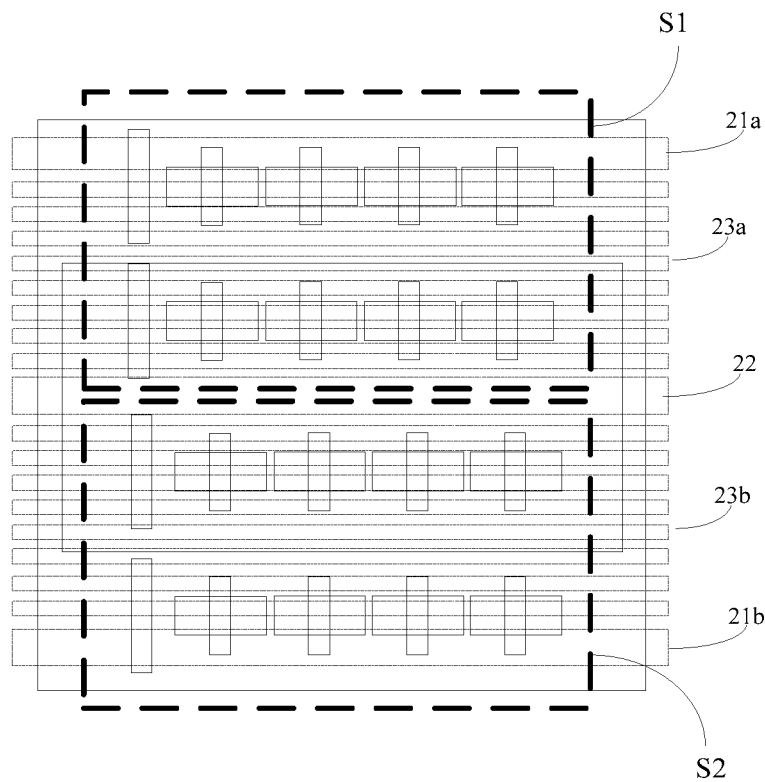
FIG. 16 is a schematic structural diagram of a semiconductor layout structure according to an embodiment of the present disclosure.

FIG. 16 is a schematic structural diagram of a semiconductor layout structure according to an embodiment of the present disclosure. In the semiconductor layout structure as shown in FIG. 16, when the semiconductor device S1 and the semiconductor device S2 share the first ground line 22 in the first metal layer, in the direction y of the first metal layer there are in sequence included: a first power source line 21a and a plurality of signal lines 23a and a first ground line 22 corresponding to the semiconductor device S1, and a plurality of signal lines 23b and a first ground line 21b corresponding to the semiconductor device S2.

Figure 17:
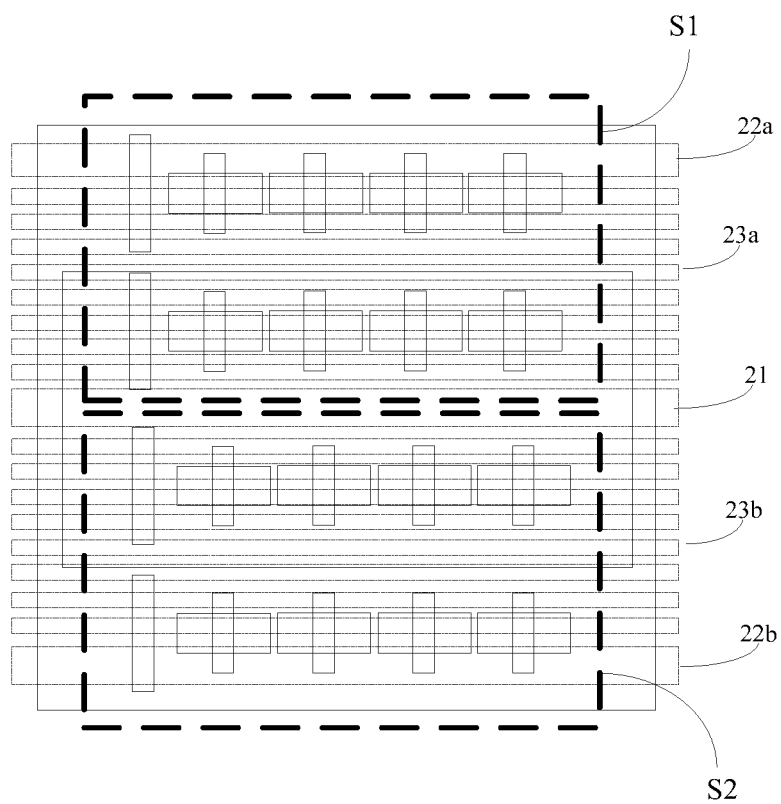
FIG. 17 is a schematic structural diagram of a semiconductor layout structure according to another embodiment of the present disclosure.

FIG. 17 is a schematic structural diagram of a semiconductor layout structure according to another embodiment of the present disclosure. When the semiconductor device S1 and the semiconductor device S2 share the first power source line 21 in the first metal layer, in the direction y of the first metal layer there are in sequence included: the first ground line 22a and a plurality of signal lines 23a and the first power source line 21 corresponding to the semiconductor device S1, and a plurality of signal lines 23b and a second ground line 22b corresponding to the semiconductor device S2.

In some other embodiments, when the standard layout structure units are arranged in pairs and when the adjacent standard layout units share a first signal line or first power source line, the guard rings of the two adjacent standard layout structure units are arranged in an up-and-down staggered fashion.

Figure 18:
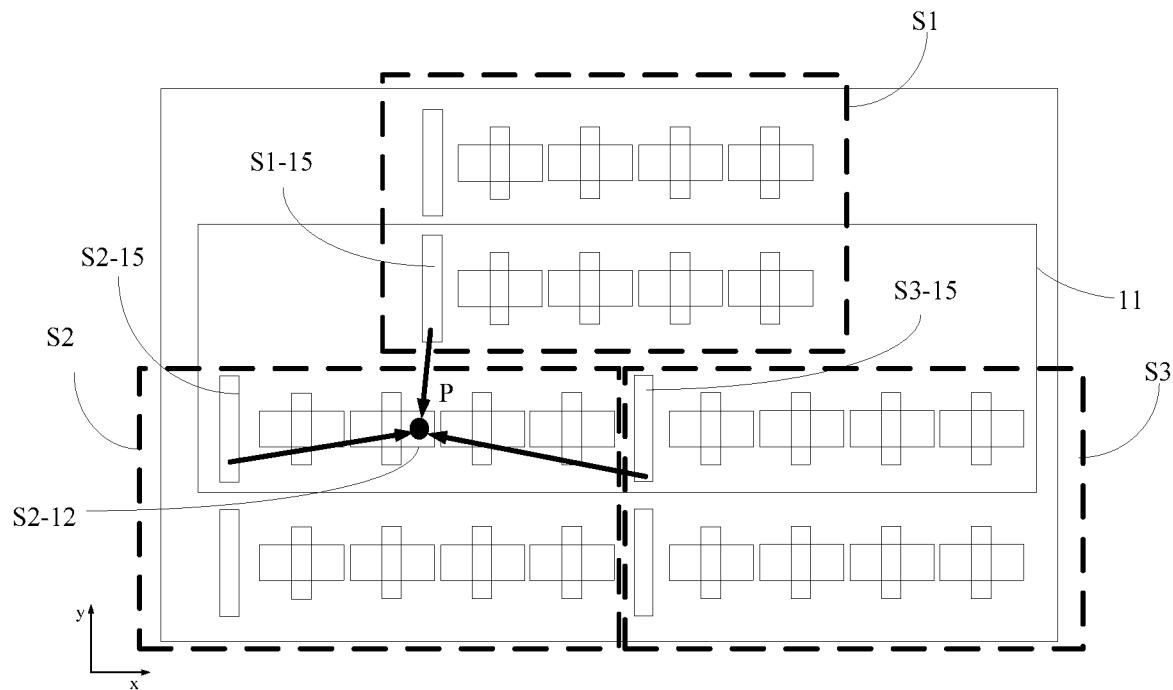
FIG. 18 is a schematic structural diagram of a device layer in the semiconductor layout structure according to an embodiment of the present disclosure.

For example, FIG. 18 is a schematic structural diagram of a device layer in the semiconductor layout structure according to an embodiment of the present disclosure. The device layer includes three semiconductor devices, which are denoted as the semiconductor device S1, the semiconductor device S2, and the semiconductor device S3. The semiconductor device S2 and the semiconductor device S3 are arranged in sequence in the direction x, and the semiconductor device S1 is arranged above the semiconductor device S2 and the semiconductor device S3 in the direction y. As shown in FIG. 14, the semiconductor device S1, the semiconductor device S2, and the semiconductor device S3 may share the well 11 of the second type, such that the transistor of the first type and the guard ring of the second type of the semiconductor device S1, the transistor of the first type and the guard ring of the second type of the semiconductor device S2, and the transistor of the first type and the guard ring of the second type of the semiconductor device S3 are all arranged on the same well 11 of the second type.

As shown in FIG. 18, in the direction x, the guard rings S1-15 of the second types of the standard layout unit S1 are arranged between the guard rings S2-15 of the second type of the standard layout unit S2 and the guard rings S3-15 of the second types of the standard layout unit S3. In the direction x, the guard rings of the standard layout units S2, S1 and S3 are arranged in sequence in an up-and-down staggered fashion. It is understandable that other standard layout units in the direction x may also be arranged in sequence in the up-and-down staggered fashion, just as the guard rings.

In FIG. 18, the transistors S2-12 of the first type at a point P in the standard layout unit S2 are taken as an example. When the guard rings of the standard layout units S2, S1 and S3 are arranged in sequence in the up-and-down staggered fashion, distances between the transistors S2-12 of the first type and the guard rings S1-15 of the second type of the standard layout unit S1, distances between the transistors S2-12 of the first type and the guard rings S2-15 of the second type of the standard layout unit S2, and distances between the transistors S2-12 of the first type and the guard rings S3-15 of the second type of the standard layout unit S3 are all smaller than a minimum diameter spacing of the guard ring of the second type. The minimum diameter spacing is a spacing between any two of the guard rings S1-15 of the second type, the guard rings S2-15 of the second type, and the guard rings S3-15 of the second type in FIG. 14. Half of the minimum diameter spacing is an action range of one guard ring of the second type, and the transistors S2-12 of the first type at the point P are simultaneously positioned within the action ranges of the three guard rings of the second type. All the guard rings of the second types of the three standard layout units may act on the transistors S2-12 of the first type at the point P, to achieve more effective and comprehensive protection for the transistors S2-12 of the first type.

Figure 19:
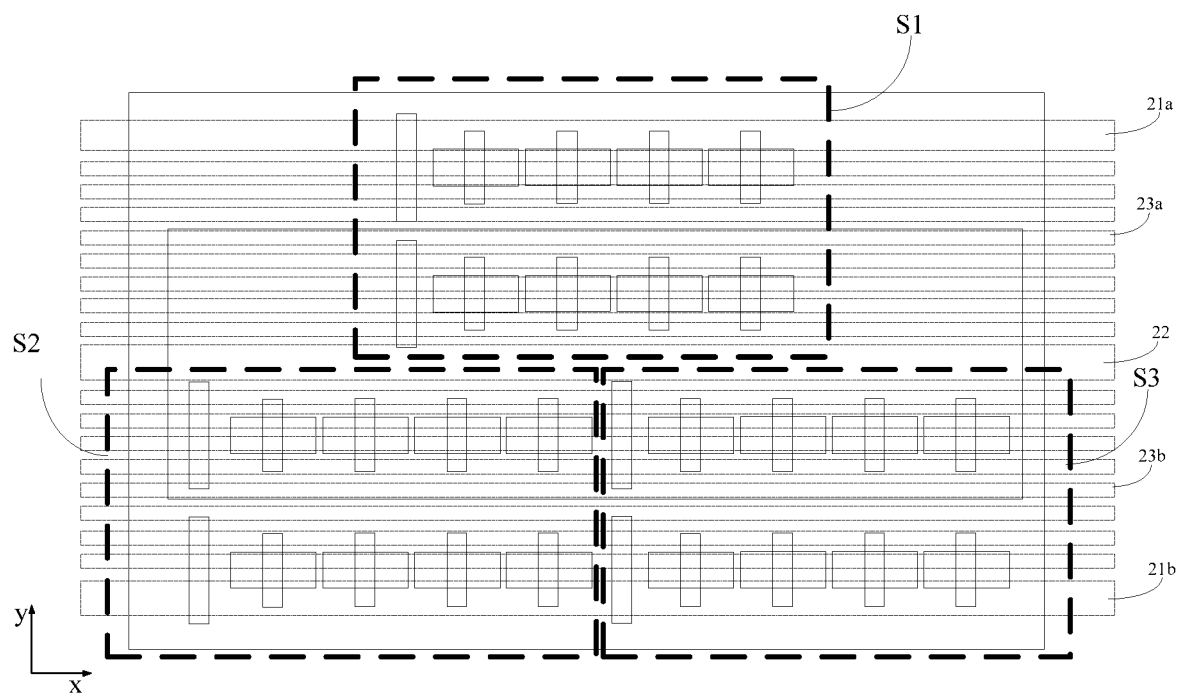
FIG. 19 is a schematic structural diagram of a semiconductor layout structure according to an embodiment of the present disclosure.

FIG. 19 is a schematic structural diagram of a semiconductor layout structure according to an embodiment of the present disclosure. In the semiconductor layout structure as shown in FIG. 18, when the semiconductor device S1, the semiconductor device S2 and the semiconductor device S3 share the first ground line 22 in the first metal layer, in the direction y in sequence, the first metal layer includes: the first power source line 21a and a plurality of signal lines 23a and the first ground line 22 corresponding to the semiconductor device S1, and a plurality of signal lines 23b and the first ground line 21b corresponding to the semiconductor device S2 the semiconductor device S3.

Figure 20:
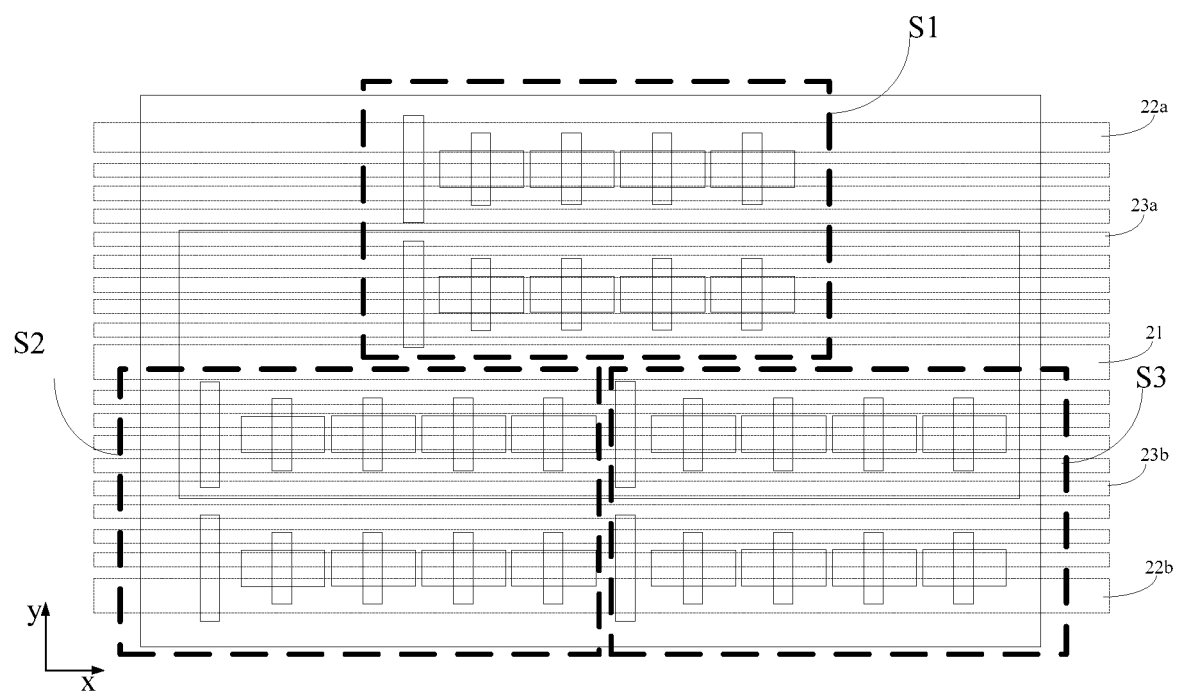
FIG. 20 is a schematic structural diagram of a semiconductor layout structure according to another embodiment of the present disclosure.

FIG. 20 is a schematic structural diagram of a semiconductor layout structure according to another embodiment of the present disclosure. When the semiconductor device S1, the semiconductor device S2 and the semiconductor device S3 share the first power source line in the first metal layer, in the direction y in sequence, the first metal layer includes: the first ground line 22a and a plurality of signal lines 23a and the first power source line 21 corresponding to the semiconductor device S1, and a plurality of signal lines 23b and the second power source line 22b corresponding to the semiconductor device S2 and the semiconductor device S3. Further, the overall width of the semiconductor layout structure in the direction y may be reduced, thereby achieving the technical effect of reducing the size of the semiconductor layout structure.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A semiconductor device, comprising:
   a substrate of a first type;
   a well of a second type, arranged on the substrate of the first type;
   multiple transistors of a first type, arranged along a first direction on the well of the second type;
   multiple transistors of a second type, arranged along the first direction on the substrate of the first type;
   at least one guard ring of a first type, the at least one guard ring of the first type being arranged on the substrate of the first type and being positioned only on a first side of the multiple transistors of the second type; and
   at least one guard ring of a second type, the at least one guard ring of the second type being arranged on the well of the second type and being positioned only on the first side of the multiple transistors of the first type; and
   wherein the first side is orthogonal to the first direction.

2. The semiconductor device according to claim 1, wherein
the first type is a P type, the second type being an N type.

3. A semiconductor layout structure, comprising:
a device layer including a semiconductor device; and
a first metal layer positioned above the device layer, the first metal layer being configured to control the semiconductor device;
wherein the semiconductor device comprises:
a substrate of a first type;
a well of a second type, arranged on the substrate of the first type;
multiple transistors of a first type, arranged along a first direction on the well of the second type;
multiple transistors of a second type, arranged along the first direction on the substrate of the first type;
at least one guard ring of a first type, the at least one guard ring of the first type being arranged on the substrate of the first type and being positioned only on a first side of the multiple transistors of the second type; and
at least one guard ring of a second type, the at least one guard ring of the second type being arranged on the well of the second type and being positioned only on the first side of the multiple transistors of the first type; and
wherein the first side is orthogonal to the first direction.

4. The semiconductor layout structure according to claim 3, wherein the first metal layer comprises:
a first power source line, a first ground line and a plurality of signal lines extending in the first direction; wherein
the plurality of signal lines are positioned between the first power source line and the first ground line.

5. The semiconductor layout structure according to claim 4, wherein
the device layer and the first metal layer form a plurality of standard layout structure units; and
the plurality of standard layout structure units share the first power source line.

6. The semiconductor layout structure according to claim 5, wherein
device layers in the plurality of standard layout structure units share the well of the second type.

7. The semiconductor layout structure according to claim 4, further comprising:
a second metal layer positioned above the first metal layer and connected to the first metal layer.

8. The semiconductor layout structure according to claim 7, wherein the second metal layer comprises:
a plurality of second power source lines and a plurality of second ground lines extending in a second direction; wherein
the second direction is orthogonal to the first direction.

9. The semiconductor layout structure according to claim 8, wherein
at least two of the plurality of second power source lines are connected to the first power source line through connection holes; and
at least two of the plurality of second ground lines are connected to the first ground line through the connection holes.

10. The semiconductor layout structure according to claim 8, wherein
each of the plurality of second power source lines is connected to the first power source line only through one of the connection holes; and
each of the plurality of second ground lines is connected to the first ground lines only through one of the connection holes.

11. A semiconductor layout structure, comprising:
a device layer, the device layer comprising: a substrate of a first type, a well of a second type, a plurality of transistors of a first type, a plurality of transistors of a second type, at least one guard ring of a first type, and at least one guard ring of a second type; and
a first metal layer, the first metal layer being positioned above the device layer and configured to control the device layer, the device layer and the first metal layer form a plurality of standard layout structure units; wherein
the well of the second type is arranged on the substrate of the first type, the plurality of transistors of the first type are arranged along a first direction on the well of the second type, and the plurality of transistors of the second type are arranged along a first direction on the substrate of the first type;
the at least one guard ring of the first type is arranged on the substrate of the first type and positioned only on a first side of the plurality of transistors of the second type;
the at least one guard ring of the second type is arranged on the well of the second type and positioned only on the first side of the plurality of transistors of the first type;
wherein the first side is orthogonal to the first direction.

12. The semiconductor layout structure according to claim 11, wherein the first metal layer comprises:
a first power source line, a first ground line and a plurality of signal lines extending in the first direction, the plurality of signal lines being positioned between the first power source line and the first ground line.

13. The semiconductor layout structure according to claim 12, wherein
the plurality of standard layout structure units share the first power source line.

14. The semiconductor layout structure according to claim 13, wherein
the guard rings of adjacent two of the plurality of standard layout structure units are arranged in an up-and-down staggered fashion.

15. The semiconductor layout structure according to claim 13, wherein
device layers in the plurality of standard layout structure units share the well of the second type.

16. The semiconductor layout structure according to claim 11, further comprising:
a second metal layer, the second metal layer being positioned above the first metal layer and connected to the first metal layer.

17. The semiconductor layout structure according to claim 16, wherein
the second metal layer comprises a plurality of second power source lines and a plurality of second ground lines; and
extension directions of the plurality of second power source lines and the plurality of second ground lines are orthogonal to extension directions of the first power source line and the first ground line.

18. The semiconductor layout structure according to claim 17, wherein
at least two of the plurality of second power source lines are connected to the first power source line through connection holes; and at least two of the plurality of second ground lines are connected to the first ground line through the connection holes.

19. The semiconductor layout structure according to claim 18, wherein each of the plurality of second power source lines is connected to the first power source line only through one of the connection holes; and each of the plurality of second ground lines is connected to the first ground lines only through one of the connection holes.

* * * * *